United States Patent
Taylor, Jr. et al.

(10) Patent No.: US 9,263,340 B2
(45) Date of Patent: Feb. 16, 2016

(54) METHODS FOR REMOVING SELECTED FINS THAT ARE FORMED FOR FINFET SEMICONDUCTOR DEVICES

(71) Applicant: GLOBALFOUNDRIES Inc., Grand Cayman, KY (US)

(72) Inventors: William J. Taylor, Jr., Clifton Park, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

(21) Appl. No.: 14/268,415

(22) Filed: May 2, 2014

(65) Prior Publication Data

US 2015/0318215 A1   Nov. 5, 2015

(51) Int. Cl.
   H01L 21/8234 (2006.01)
   H01L 21/762 (2006.01)
   H01L 21/308 (2006.01)
   H01L 21/311 (2006.01)
   H01L 21/306 (2006.01)
   H01L 27/088 (2006.01)
   H01L 29/06 (2006.01)

(52) U.S. Cl.
   CPC ...... *H01L 21/823431* (2013.01); *H01L 21/308* (2013.01); *H01L 21/30604* (2013.01); *H01L 21/31111* (2013.01); *H01L 21/76224* (2013.01); *H01L 21/823481* (2013.01); *H01L 27/0886* (2013.01); *H01L 29/0653* (2013.01)

(58) Field of Classification Search
   None
   See application file for complete search history.

(56) References Cited

U.S. PATENT DOCUMENTS 8,617,996 B1 * 12/2013 Chi et al. ............... 438/700

* cited by examiner

*Primary Examiner* — Bilkis Jahan
*Assistant Examiner* — Kevin Quinto
(74) *Attorney, Agent, or Firm* — Amerson Law Firm, PLLC

(57) ABSTRACT

One illustrative method disclosed herein includes, among other things, forming a plurality of trenches in a semiconductor substrate to thereby define a plurality of fins in the substrate, forming a layer of insulating material in the trenches, performing an etching process sequence to remove at least a portion of one of the plurality of fins and thereby define a fin cavity, wherein the etching process sequence includes performing a first anisotropic etching process and, after performing the first anisotropic etching process, performing a second isotropic etching process. In this embodiment, the method concludes with the step of forming additional insulating material in the fin cavity.

16 Claims, 12 Drawing Sheets

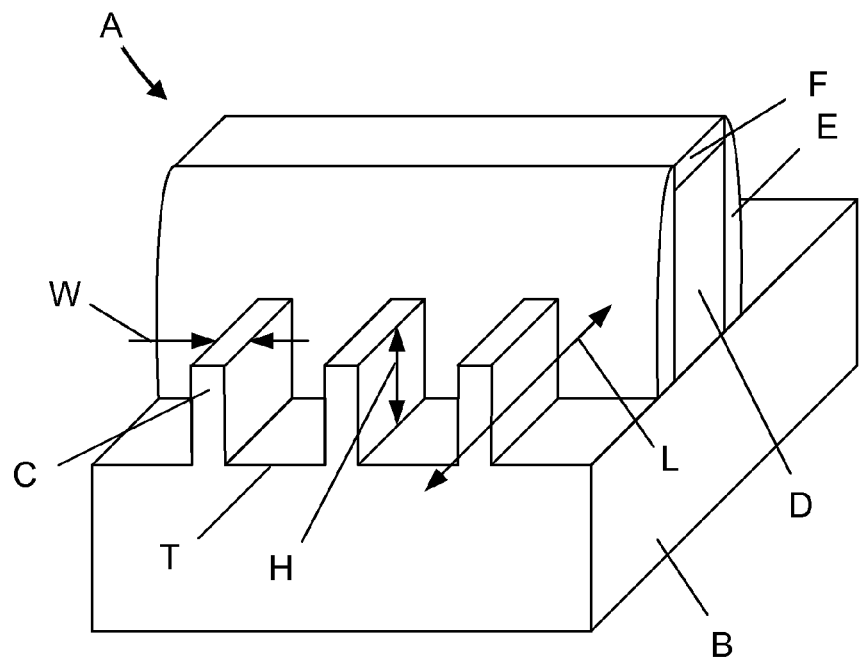
Figure 1A (Prior Art)
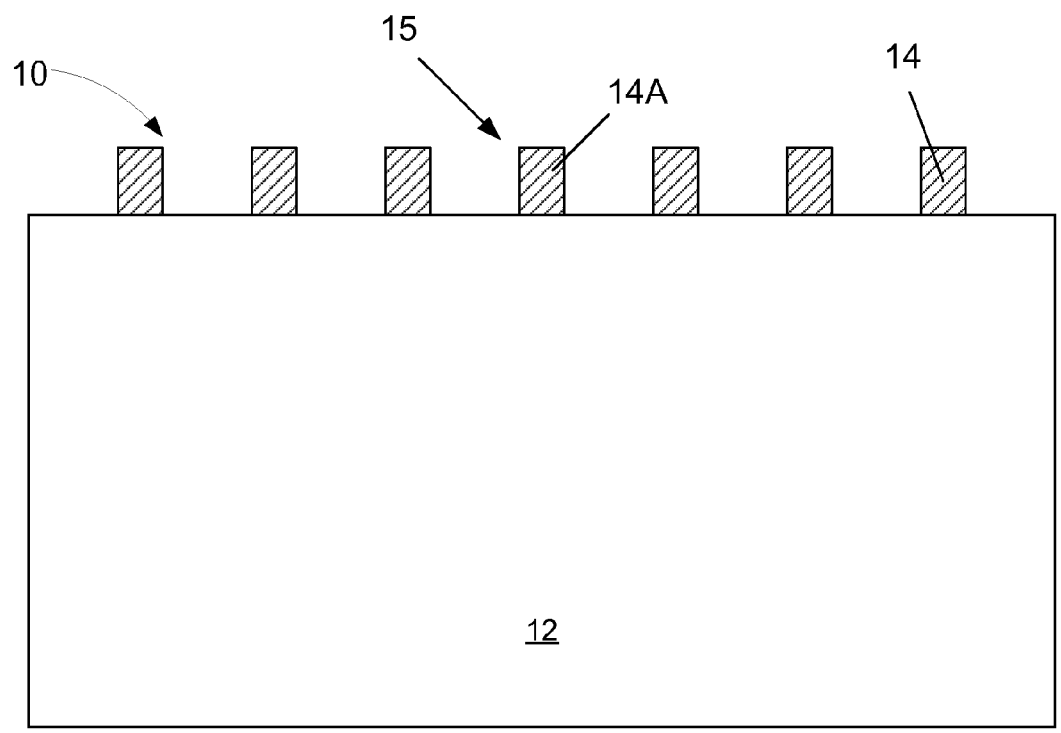
(Prior Art) Figure 1B

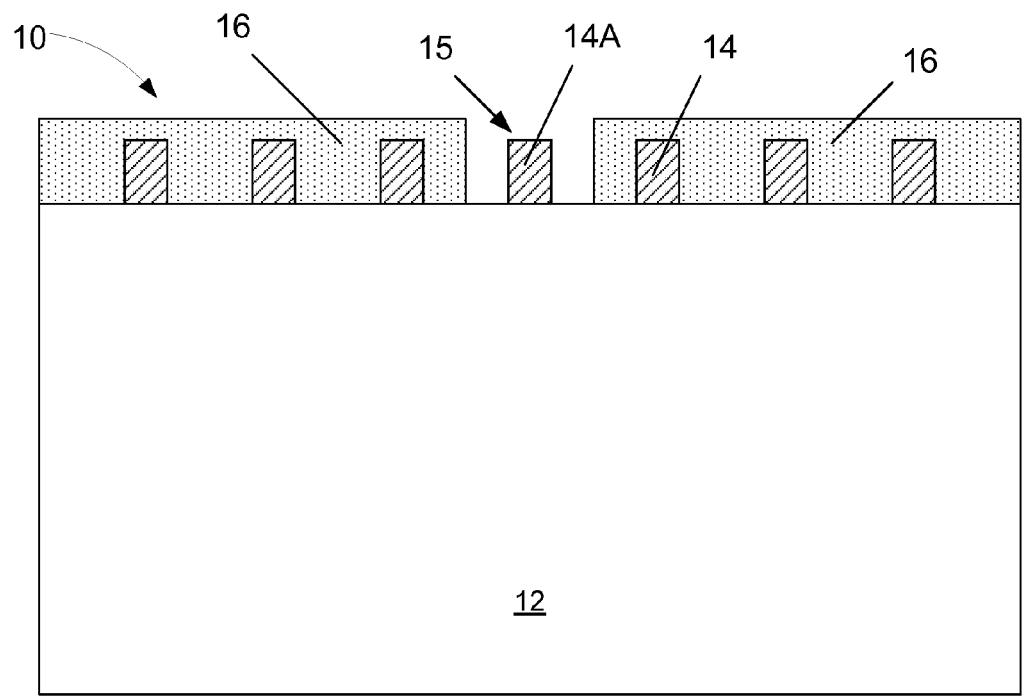
(Prior Art) Figure 1C
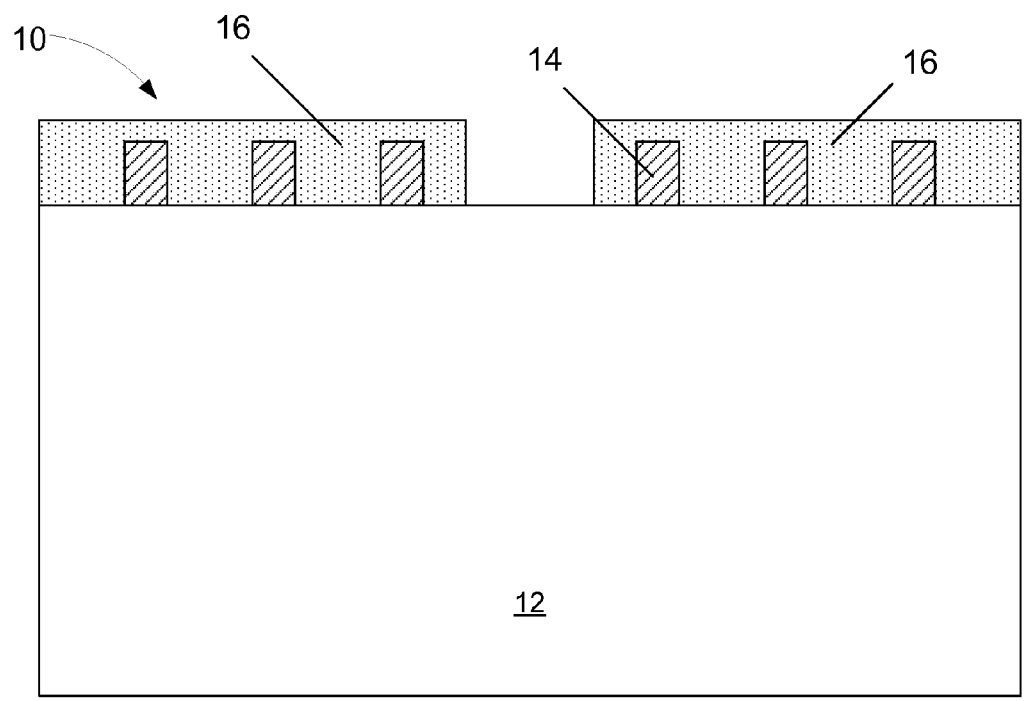
(Prior Art) Figure 1D

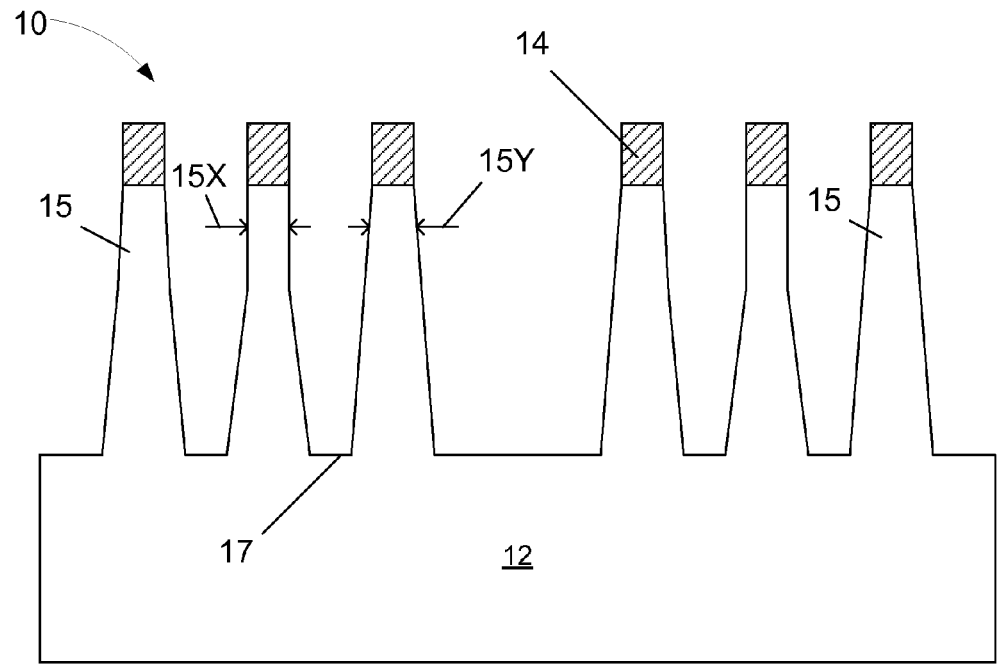
(Prior Art) Figure 1E
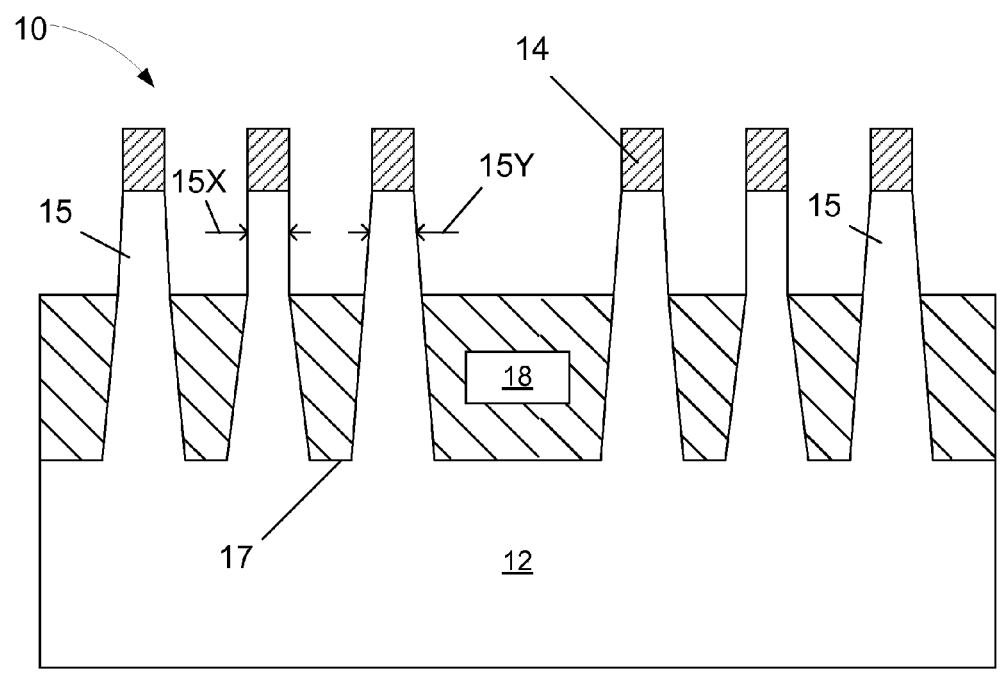
(Prior Art) Figure 1F

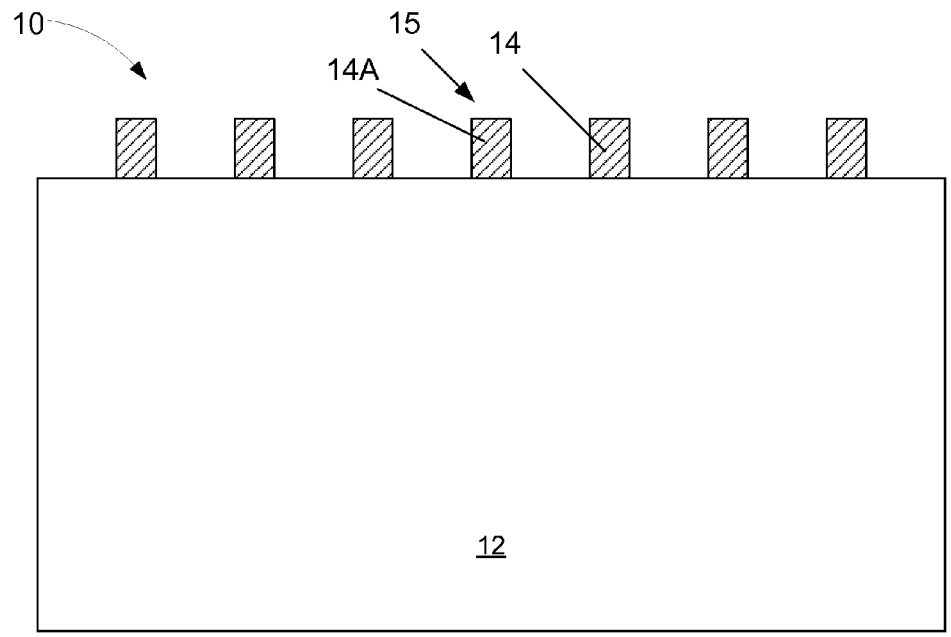
(Prior Art) Figure 1G
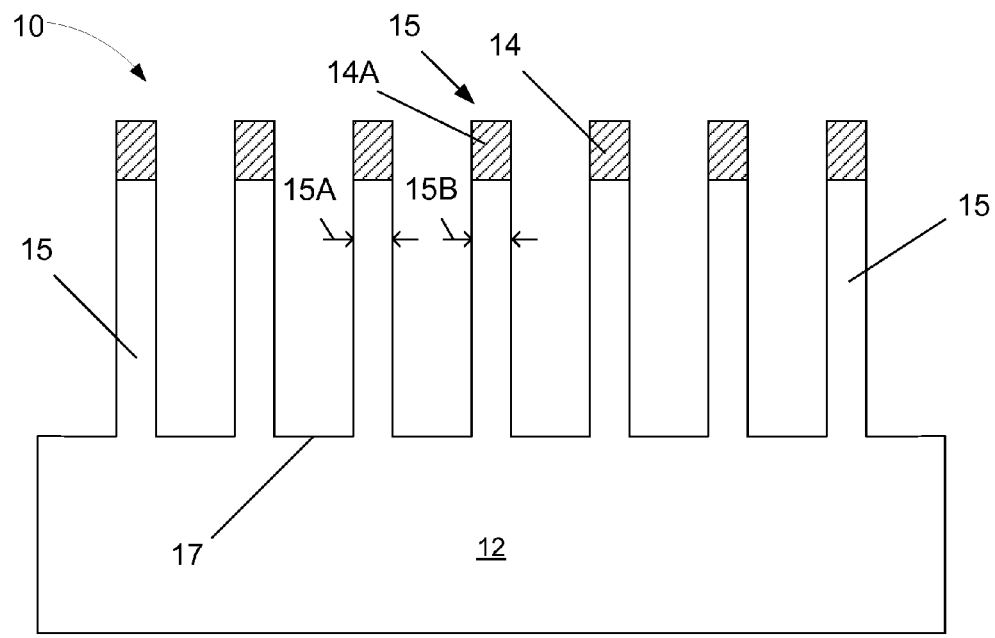
(Prior Art) Figure 1H

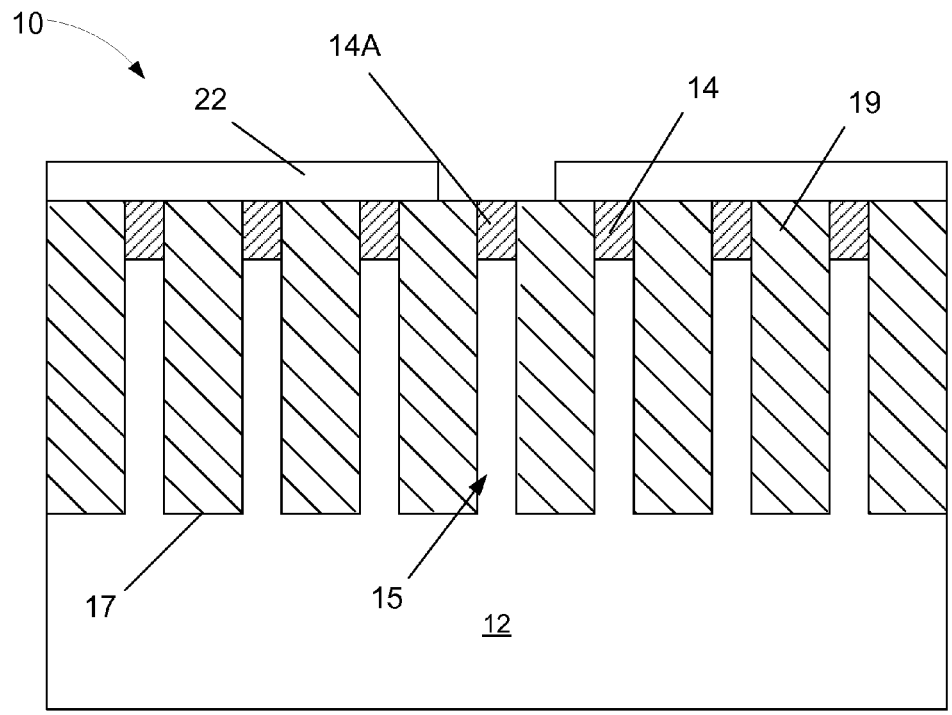
(Prior Art) Figure 1I
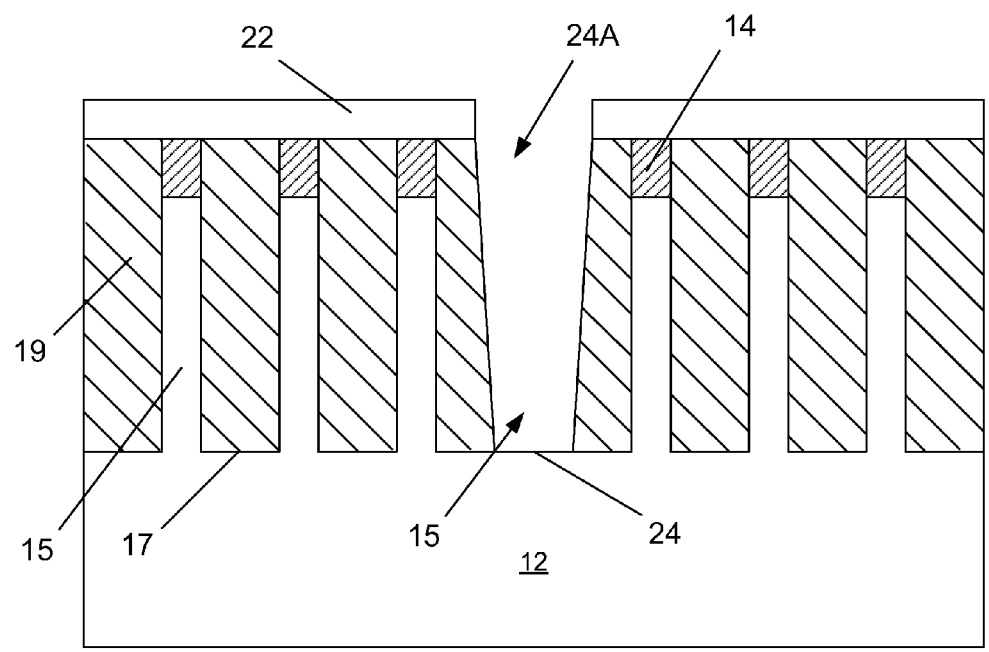
(Prior Art) Figure 1J

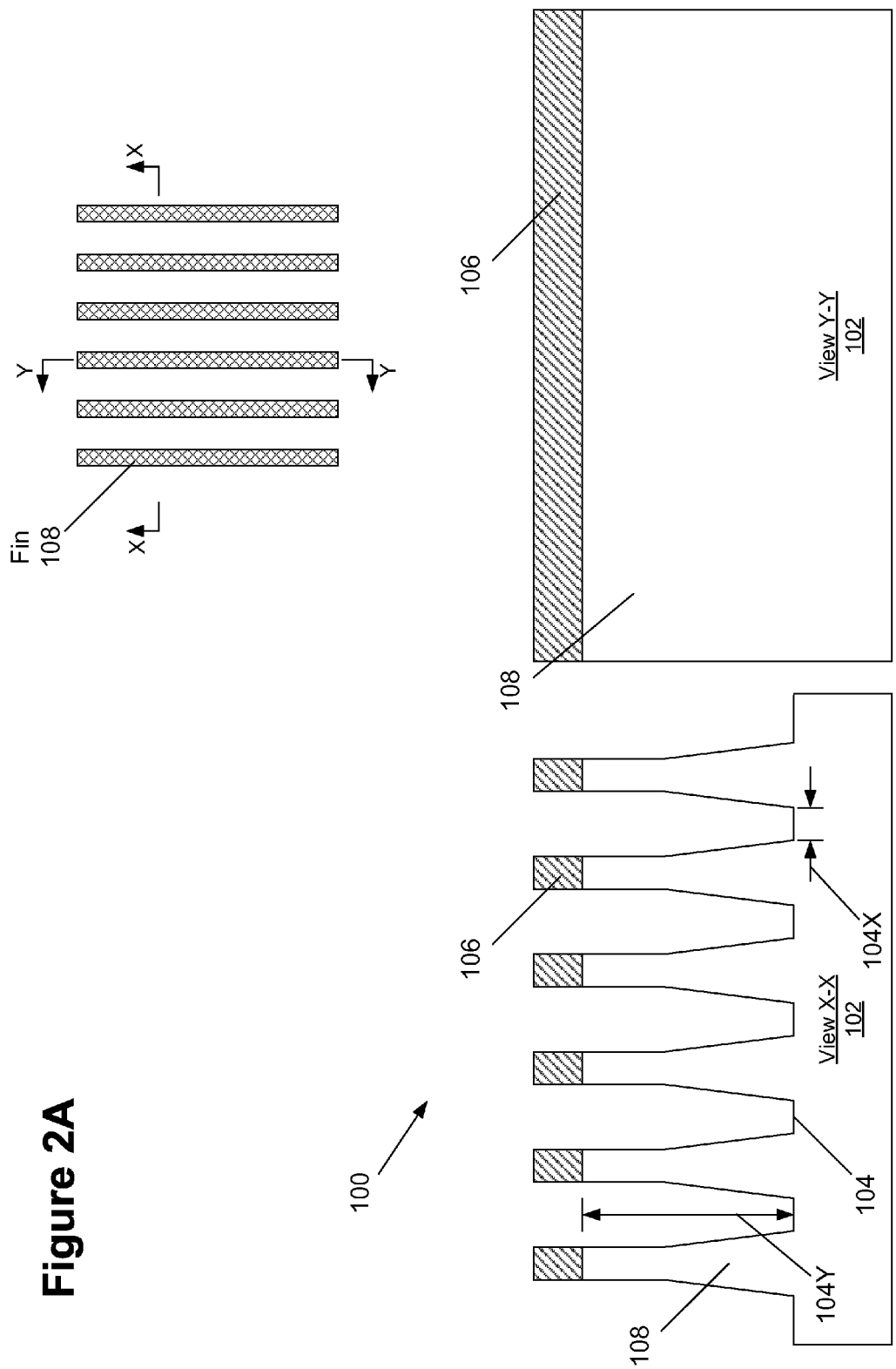

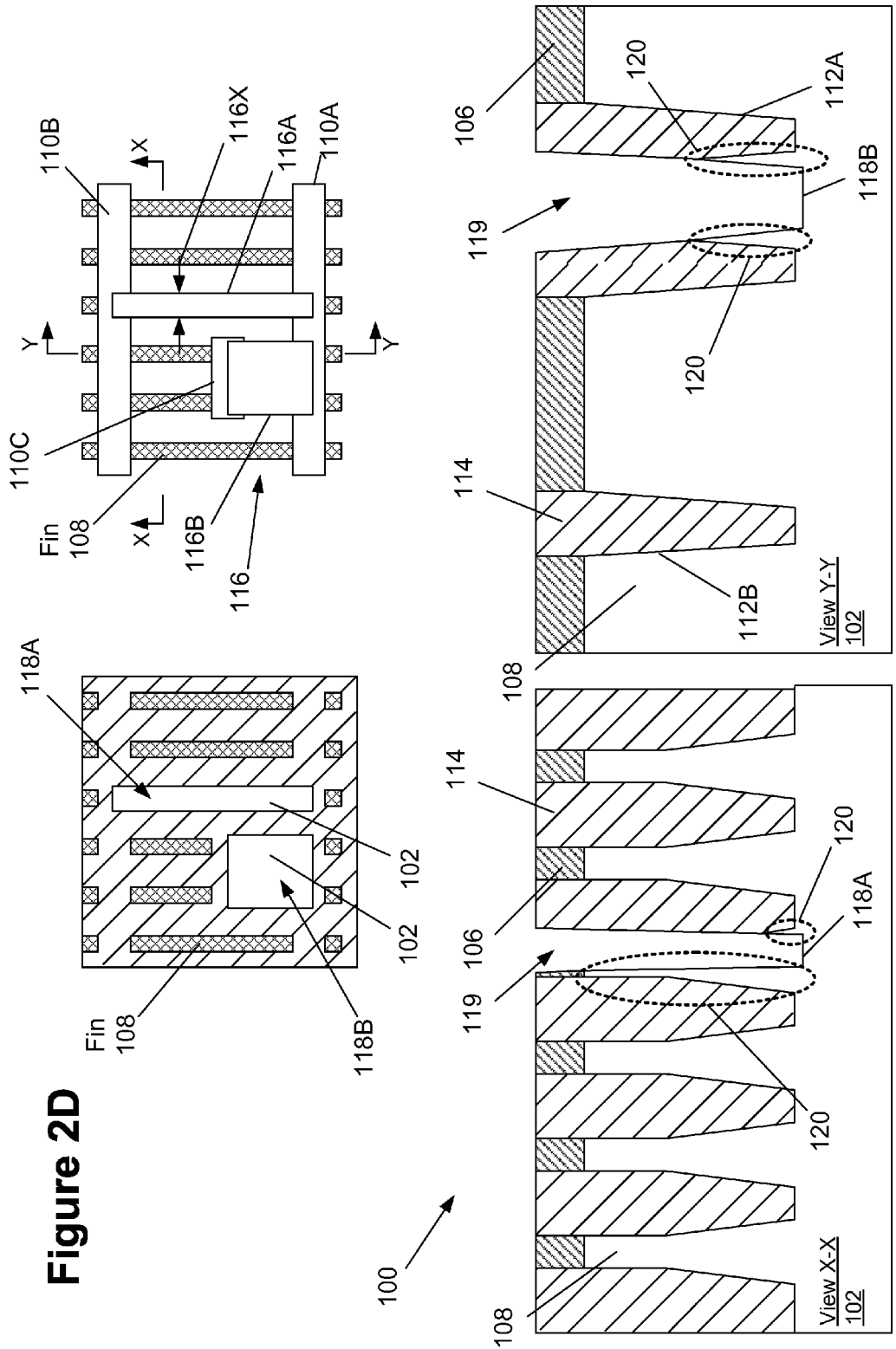

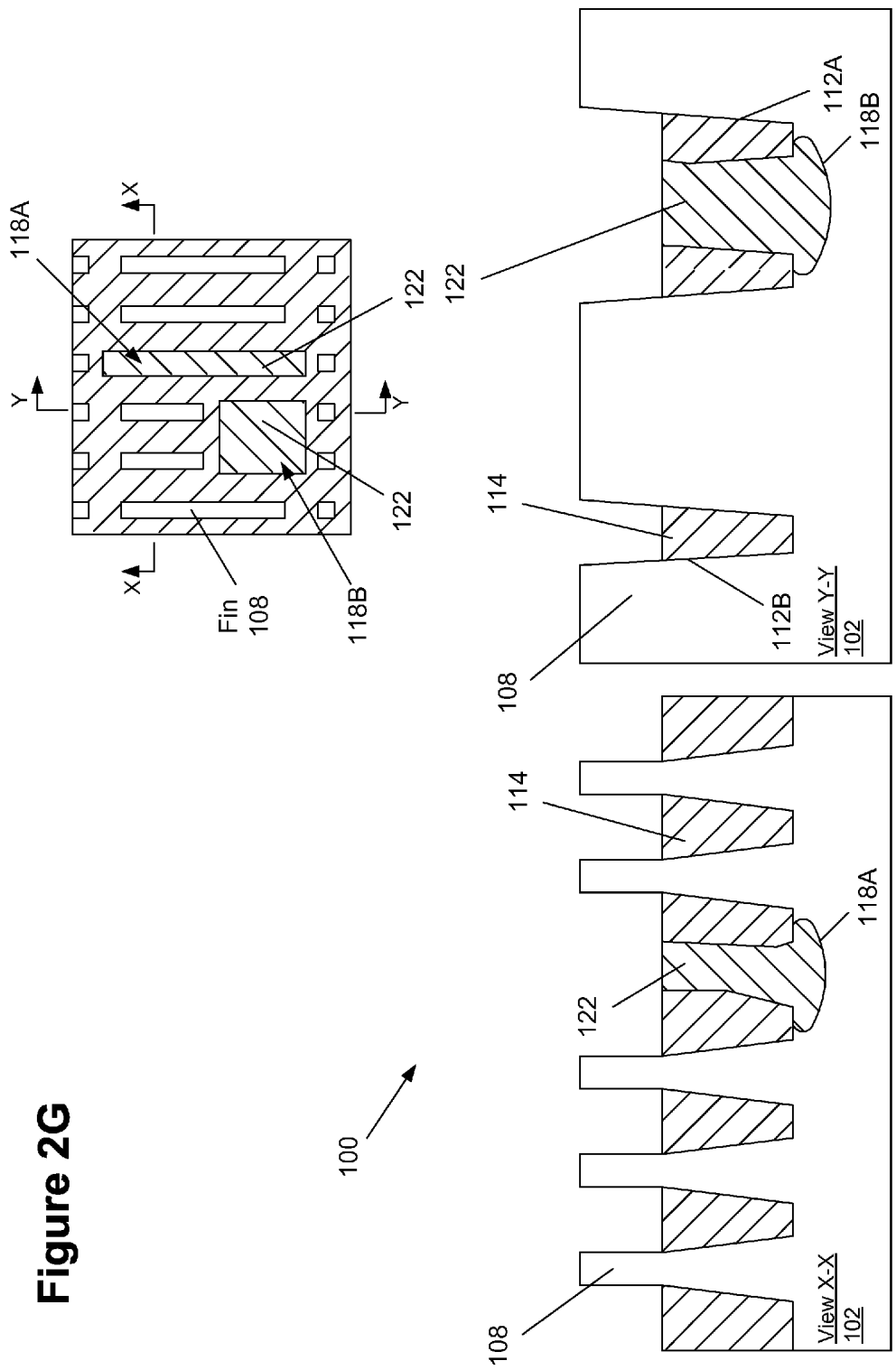

METHODS FOR REMOVING SELECTED FINS THAT ARE FORMED FOR FINFET SEMICONDUCTOR DEVICES

BACKGROUND OF THE INVENTION

1. Field of the Invention

Generally, the present disclosure relates to the manufacture of semiconductor devices, and, more specifically, to various methods for removing selected fins that are formed for FinFET semiconductor devices.

2. Description of the Related Art

FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. The FinFET device may have either a tri-gate or a dual gate channel structure. In a FinFET device, a channel is formed perpendicular to a surface of the semiconducting substrate so as to reduce the physical size of the semiconductor device. Accordingly, for a given plot space (or footprint), FinFETs tend to be able to generate significantly higher drive current density than planar transistor devices.

A shallow trench isolation structure (not shown) is formed in the semiconducting substrate around the FinFET device so as to electrically isolate the FinFET device. Traditionally, isolation structures were always the first structures that were formed when manufacturing semiconductor devices. The isolation structures were formed by etching the trenches for the isolation structures and thereafter filling the trenches with the desired insulating material, e.g., silicon dioxide. Thereafter, the isolation structures were masked and trenches were etched into the substrate so as to define the fins. However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches T in the substrate B to define multiple "fins" that extend across the substrate, and thereafter remove some of the fins C where larger isolation structures will be formed. Using this type of manufacturing approach, better accuracy and repeatability may be achieved in forming the fins C to very small dimensions due to the more uniform environment in which the etching process that forms the trenches T is performed.

After the trenches T have been formed, some of the fins C must be removed to create room for or define the spaces where isolation regions will ultimately be formed. There are two commonly employed techniques for accomplishing the goal of removing the desired number of fins C. One such removal process is typically referred to as "Fins-cut-First," as will be described with reference to FIGS. 1B-1E. Accordingly, FIG. 1B depicts the device 10 after a patterned hard mask layer 14, e.g., a patterned layer of silicon nitride, was formed above the substrate 12 in accordance with the desired fin pattern and pitch. In the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1C depicts the device 10 after a patterned masking layer 16, e.g., a patterned layer of photoresist, has been formed above the patterned hard mask layer 14. The patterned masking layer 16 has an opening that exposes the feature 14A for removal.

FIG. 1D depicts the device 10 after an etching process has been performed through the patterned masking layer 16 so as to remove the exposed feature 14A of the patterned hard mask layer 14.

FIG. 1E depicts the device 10 after the patterned masking layer 16 was removed and after an etching process was performed through the patterned hard mask layer 14 (without the feature 14A) so as to define full-depth trenches 17 in the substrate 12 that define the fins 15. Due to the removal of the feature 14A, this etching process removes the portions of the substrate 12 that would have otherwise formed a fin 15 in the area under the feature 14A. One problem with the "fin-cut-first" approach is that it inevitably causes different fin sizes, i.e., the dimensions 15X and 15Y are different. This is especially true between fins 15 inside an array of fins and the fins at the edge of the active region that is close to the isolation region. This occurs due to etch loading effects wherein there are different etch rates and etch profiles due to differing patterning densities, pitch, etc.

FIG. 1F depicts the device 10 after several process operations were performed. First, a layer of insulating material 18, such as silicon dioxide, was formed so as to overfill the trenches 17. A chemical mechanical polishing (CMP) process was then performed to planarize the upper surface of the insulating material 18 with the top of the patterned hard mask 14. Thereafter, an etch-back process was performed to recess the layer of insulating material 18 between the fins 15 and thereby expose the upper portions of the fins 15, which corresponds to the final fin height of the fins 15. At this point in the process, the patterned hard mask 14 may or may not be thereafter removed. Next, the gate structure of the device 10 may be formed using either gate-first or gate-last manufacturing techniques.

Another fin removal process is typically referred to as "Fins-cut-Last," as will be described with reference to FIGS. 1G-1J. FIG. 1G depicts the device 10 after the patterned hard mask layer 14 was formed above the substrate 12 in accordance with the desired fin pattern and pitch. As before, in the depicted example, only a single fin will be removed, i.e., the fin 15 corresponding to the feature 14A to make room for the isolation region. However, as will be recognized by those skilled in the art, depending upon the desired final size of the isolation region, more than one fin may be removed.

FIG. 1H depicts the device 10 after an etching process was performed through the patterned hard mask layer 14 so as to define full-depth trenches 17 in the substrate 12 that define the fins 15. Note that, in the Fins-cut-Last approach, the size of the fins is very uniform, i.e., the dimension 15A is approximately equal to the dimension 15B. This is primarily due to the fact that, in this approach, fins 15 are formed everywhere on the wafer and there is no undesirable etch loading effects.

FIG. 1I depicts the device 10 after several process operations were performed. First, a layer of insulating material 19, such as silicon dioxide, was formed so as to overfill the trenches 17. Then a CMP process was performed to planarize the upper surface of the layer of insulating material 19 with the patterned hard mask layer 14. Next, a patterned masking layer 22, e.g., a patterned layer of photoresist, was formed above the layer of insulating material 19. The patterned hard mask layer 22 has an opening that exposes the underlying fin for removal.

FIG. 1J depicts the device 10 after one or more etching processes were performed to remove the exposed portions of the layer of insulating material 19, the exposed portions of the hard mask layer 14, i.e., the feature 14A, and the underlying fin 15 by forming a trench 24 in the substrate 12. Inevitably, there will be some tapering of the sidewalls of the trench 24. Although not depicted in the drawings, after the trench 24 is formed, the patterned masking layer 22 will be removed and additional oxide material (not shown) will be formed through the opening 24A in the trench 24 where the fin 15 was removed. Then a chemical mechanical polishing (CMP) process will be performed to planarize the upper surface of all of the insulating materials with the top of the patterned hard mask 14. Thereafter, the isolation regions between devices will be masked and an etch-back process will be performed to recess the layer of insulating material 19 between the fins 15 for each device and thereby expose the upper portions of the fins 15, which corresponds to the final fin height of the fins 15.

One problem with the fins-cut-last approach is that if the size (CD) of the opening 24A of the trench 24 is relatively large, then there is less margin for misalignment error when removing the unwanted fin, i.e., there is less margin for error so as to avoid damage to the adjacent fins when the trench 24 is etched. Additionally, although not depicted, if the size of the opening 24A is kept small, there will typically be some residual portion of the fin 15 remaining at the bottom of the trench 24. Conversely, if the size of the opening 24A is increased in an effort to insure complete removal of the unwanted fin at the bottom of the trench 24, then there is a much greater likelihood of damaging the fins adjacent the trench 24 when it is etched. These issues only get worse as the depth of the trench 24 increases. Moreover, in many applications, e.g., SRAMs, it is often the case where only a single fin will need to be removed from the array or group of fins as initially formed. Removing a single fin without damaging adjacent fins is very difficult for at least the reasons noted above.

The present disclosure is directed to various methods of forming fins for FinFET semiconductor devices and the selective removal of some of the fins that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for removing selected fins that are formed for FinFET semiconductor devices. One illustrative method disclosed herein includes, among other things, forming a plurality of trenches in a semiconductor substrate to thereby define a plurality of fins in the substrate, forming a layer of insulating material in the trenches, performing an etching process sequence to remove at least a portion of one of the plurality of fins and thereby define a fin cavity, wherein the etching process sequence comprises performing a first anisotropic etching process and, after performing the first anisotropic etching process, performing a second isotropic etching process. In this embodiment, the method concludes with the step of forming additional insulating material in the fin cavity.

Another illustrative method includes, among other things, forming a plurality of trenches in a semiconductor substrate to thereby define a plurality of fins in the substrate, the plurality of fin-formation trenches having a first depth, forming a layer of insulating material in the trenches, performing a first anisotropic etching process to remove at least a portion of one of the plurality of fins and thereby define an initial fin cavity having a second depth that is greater than the first depth and a bottom width, after performing the first anisotropic etching process, performing a second isotropic etching process to define a final fin cavity, wherein the final fin cavity has a third depth that is greater than the second depth and a second width at a bottom of the final fin cavity that is greater than the bottom width, and forming additional insulating material in the final fin cavity.

Yet another illustrative method disclosed herein includes, among other things, forming a plurality of fin-formation trenches in a semiconductor substrate to thereby define a plurality of fins in the substrate, performing a fin-cut etching process to form a plurality of fin-cut trenches, forming a layer of insulating material in the fin-formation trenches and in the fin-cut trenches, performing a fin removal etching process sequence to remove at least a portion of one of the plurality of fins and thereby define a fin cavity, wherein the etching process sequence comprises performing a first anisotropic etching process and, after performing the first anisotropic etching process, performing a second isotropic etching process, and forming additional insulating material in the fin cavity.

One illustrative integrated circuit device disclosed herein includes, among other things, a plurality of fin-formation trenches defined in a semiconductor substrate that define a plurality of fins having a long axis, the fin-formation trenches having a first width at a bottom of the fin-formation trenches, a fin removal trench formed in the substrate between two of the plurality of fins, the fin removal trench having a long axis that is substantially parallel to the long axis of the plurality of fins, a maximum width adjacent a bottom of the fin removal trench that is greater than the first width and at least one layer of insulating material positioned in the fin-formation trenches and in the fin removal trench.

Another illustrative integrated circuit device disclosed herein includes, among other things, a plurality of fin-formation trenches defined in a semiconductor substrate that define a plurality of fins having a long axis, the fin-formation trenches having a first depth, a fin removal trench formed in the substrate between two of the plurality of fins, wherein the fin removal trench has a long axis that is substantially parallel to the long axis of the plurality of fins, wherein a bottom of the fin removal trench has a stepped configuration when viewed in a cross-section taken along the long axis of the fin removal trench with opposing ends of the fin removal trench having a depth that is equal to the first depth and a region between the opposing ends having a second depth at a mid-point of the region that is greater than the first depth, and an insulating material positioned in the fin-formation trenches and in the fin removal trench.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1J depict illustrative prior art methods of removing selected fin structures when forming FinFET semiconductor devices; and FIGS. 2A-2G depict various illustrative methods disclosed herein for removing selected fins that are formed for FinFET semiconductor devices.

Figure 2B:
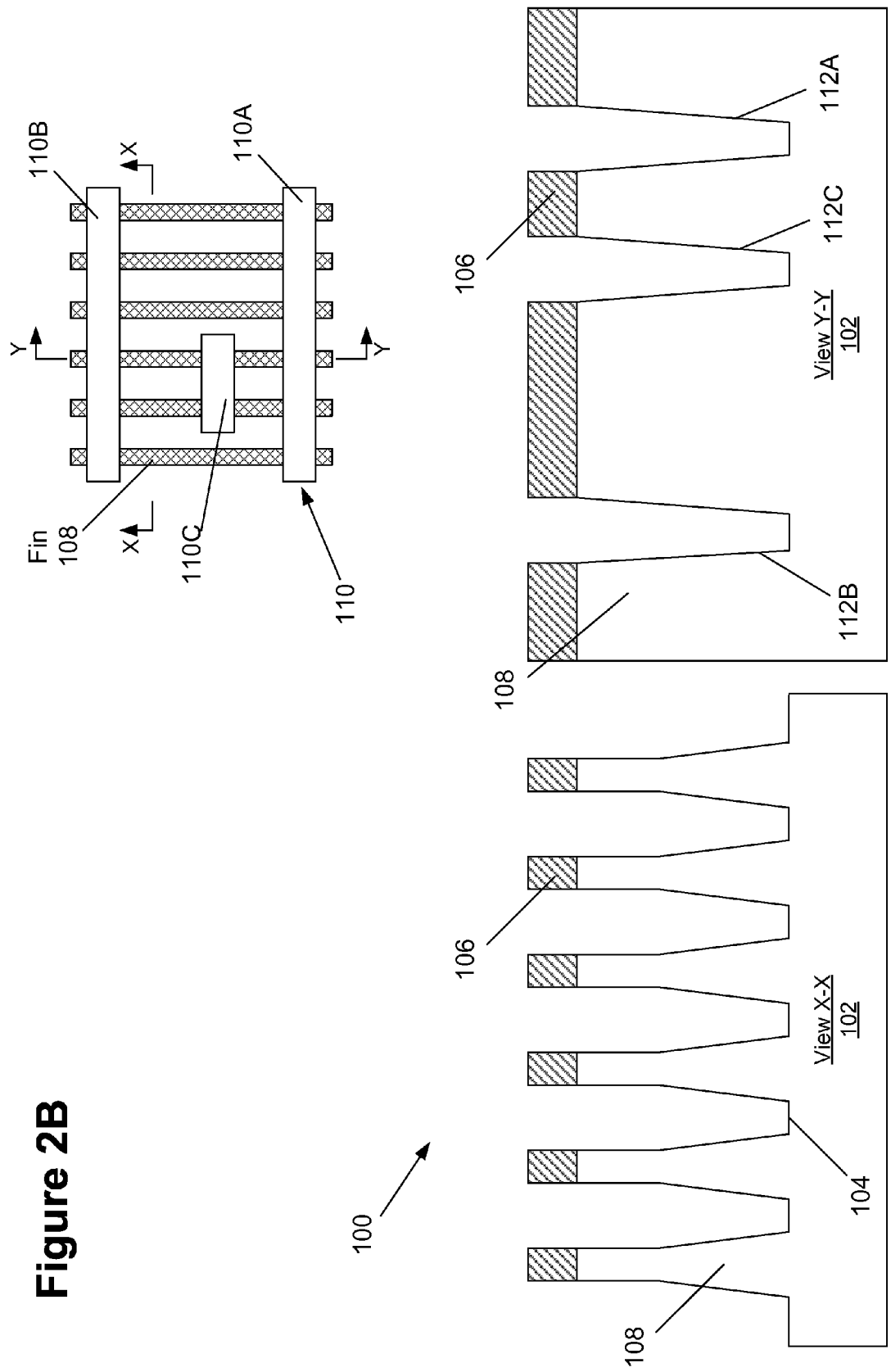

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods for removing selected fins that are formed for FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2G depict one illustrative embodiment of a method disclosed herein of forming fins on a FinFET semiconductor device 100 that is formed on a bulk semiconducting substrate 102. FIG. 2A is a simplified view of an illustrative FinFET semiconductor device 100 at an early stage of manufacturing. As will be recognized by those skilled in the art after a complete reading of the present application, the illustrative FinFET device 100 described herein may be either an N-type FinFET device or a P-type FinFET device. In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A depicts the product at a point in fabrication where a plurality of fins 108 have been formed across a substrate 102. Many FinFET devices 100 will eventually be formed above the fins 108. FIG. 2A contains a simplistic plan drawing of six of such illustrative fins 108 and indicates where various cross-sectional views in the attached drawings are taken. More specifically, the view "X-X" is a cross-sectional view that is taken across the plurality of fins 108 of the device 100 in a direction that corresponds to the gate-width direction of the FinFET devices 100 that will eventually be formed above the substrate 102, while the view "Y-Y" is a cross-sectional view that is taken through a fin 108 in a direction parallel to the current transport direction of the devices 100 when they are completed.

FIG. 2A depicts the device 100 after a patterned masking layer 106, e.g., a patterned hard mask layer, was formed above the substrate 102 that corresponds to the desired pattern of fins 108 to be formed in the substrate 102. FIG. 2A also depicts the device 100 after an etching process was performed through the patterned masking layer 106 to define a plurality of fin-formation trenches 104 in the substrate 102. The fin-formation trenches 104 define a plurality of fins 108. The fins 108 may be of any size, i.e., any size or width. In the illustrative example depicted in the attached figures, the fin-formation trenches 104 and the fins 108 are all of a uniform size and shape. However, such uniformity in the size and shape of the fin-formation trenches 104 and the fins 108 is not required to practice the inventions disclosed herein. Thus, the size and configuration of the fin-formation trenches 104, as well as the fins 108, and the manner in which they are made, should not be considered a limitation of the present invention. The patterned masking layer 106 is intended to be representative in nature as it may be comprised of a variety of materials, such as, for example, a photoresist material, silicon nitride, silicon oxynitride, etc. The patterned masking layer 106 may be formed by depositing the layer(s) of material that comprise the masking layer 106 and thereafter directly patterning the masking layer 106 using known photolithography and etching techniques. Alternatively, the patterned masking layer 106 may be formed by using known sidewall image transfer techniques. Thus, the particular form and composition of the patterned masking layer 106 and the manner in which it is made should not be considered a limitation of the present invention.

FIG. 2B depicts the device after an illustrative fin cut mask 110, having openings 110A-C formed therein, was formed above the substrate 102. For ease of explanation, only the openings 110A-C of the fin cut mask 110 are depicted in FIG. 2B. The fin cut mask 110 is used to cut the fins 108 to their desired axial length. As depicted, a timed etching process, such as an anisotropic etching process, was performed through the fin cut mask 110 to form fin-cut trenches 112A-C (see view Y-Y) in the fins 108 that correspond to the openings 110A-C, respectively. The fin cut mask 110 may be a hard mask material or it may be a patterned layer of photoresist material, and it may be formed using traditional single-patterning techniques or it may be formed using more advanced double or multiple patterning techniques.

Figure 2C:
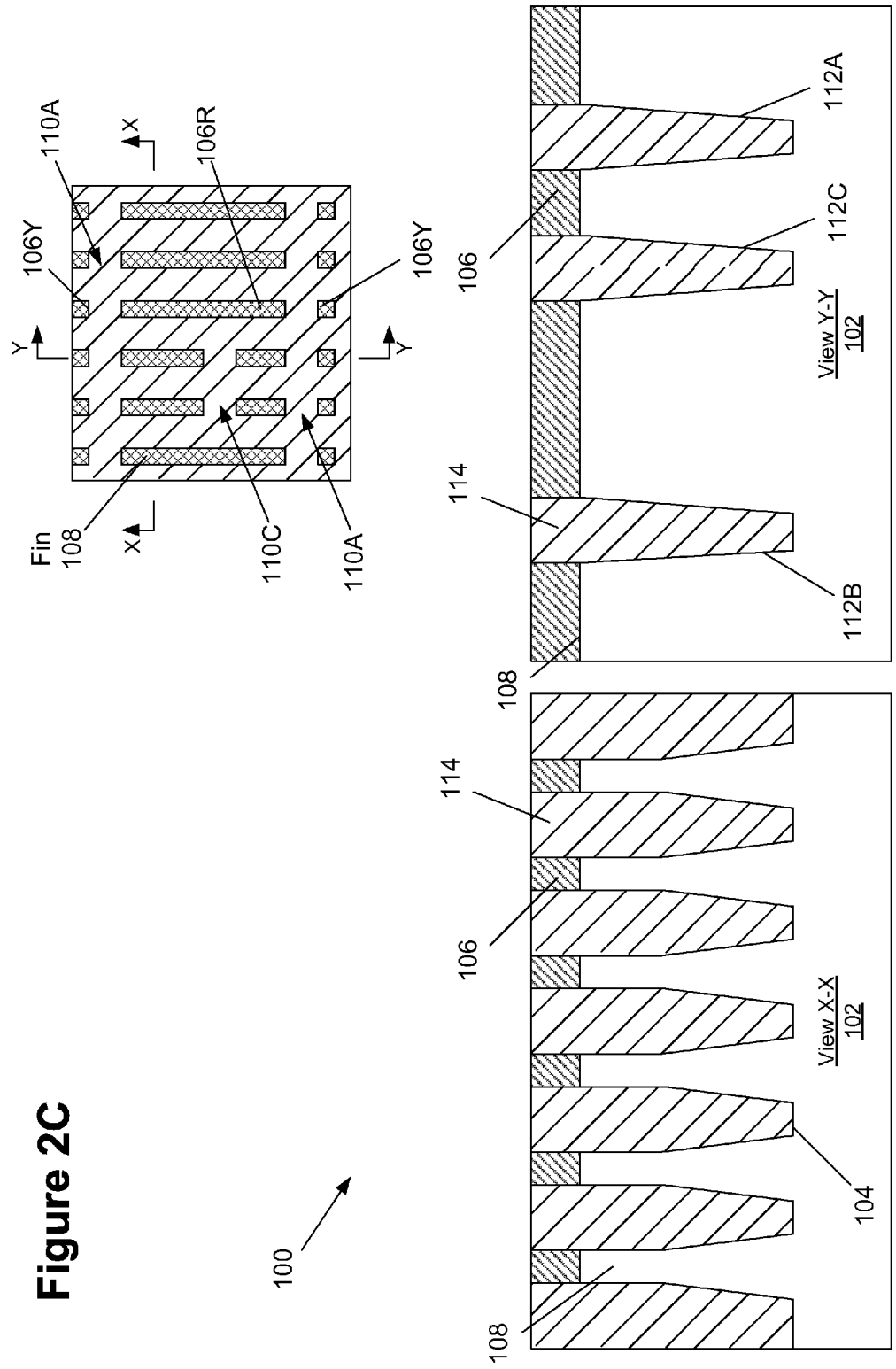

FIG. 2C depicts the device 100 after several process operations were performed. First, a layer of insulating material 114, e.g., silicon dioxide, was deposited so as to overfill the fin-formation trenches 104 and the fin-cut trenches 112A-C. Then, a chemical mechanical polishing (CMP) process was performed to planarize the upper surface of the layer of insulating material 114 with the top of the patterned hard mask 106. The plan view in FIG. 2C shows the layer of insulating material 114 with the fin cut mask 110 removed. As will be appreciated by those skilled in the art after a complete reading of the present application, forming the insulating material 114 in the fin-cut trenches 112A-C will serve to protect the ends of the remaining fins (that coincide with the edges 106Y of the hard mask 106 in the plan view) when the below-described fin removal process is performed to remove the fin 106R positioned between these two end surfaces of the adjacent fins.

FIG. 2D depicts the device 100 after several process operations were performed. First, a fin removal masking layer 116, having openings 116A and 116B was formed above the substrate 102. The purpose of the fin removal masking layer 116 is to expose the portion of the selected fins 108, or portions thereof, from the group of fins 108 that were initially formed above the substrate 102 that are to be removed. For ease of explanation, only the openings 116A-B of the fin removal masking layer 116 are depicted in the right side plan view. Also depicted are the openings 110A-C of the fin cut mask 110 for reference purposes. In general, a novel fin removal etching process sequence disclosed herein will be performed to remove the portions of the fins exposed by the fin removal masking layer 116. More specifically, a first etching process, i.e., a timed anisotropic etching process, was performed through the fin removal masking layer 116 to form fin-removal trenches 118A-B in the substrate 102 that correspond to the openings 116A-B, respectively. The fin-removal trenches 118A-B constitute initial fin cavities 119 that have a first depth and a bottom width. The fin removal masking layer 116 may be a hard mask material or it may be a patterned layer of photoresist material, and it may be formed using traditional single patterning techniques or it may be formed using more advanced double or multiple patterning techniques. Note that, due to the fact that the fin-removal trenches 118A-B were formed by performing an anisotropic etching process, portions of the fins 108 remain at the bottom of the fin-removal trenches 118A-B, as indicated in the dashed-line regions 120. Also note that, due to the nature of the anisotropic etching process, the fin removal trenches 118A-B have a substantially flat bottom at this point in the process flow.

Figure 2E:
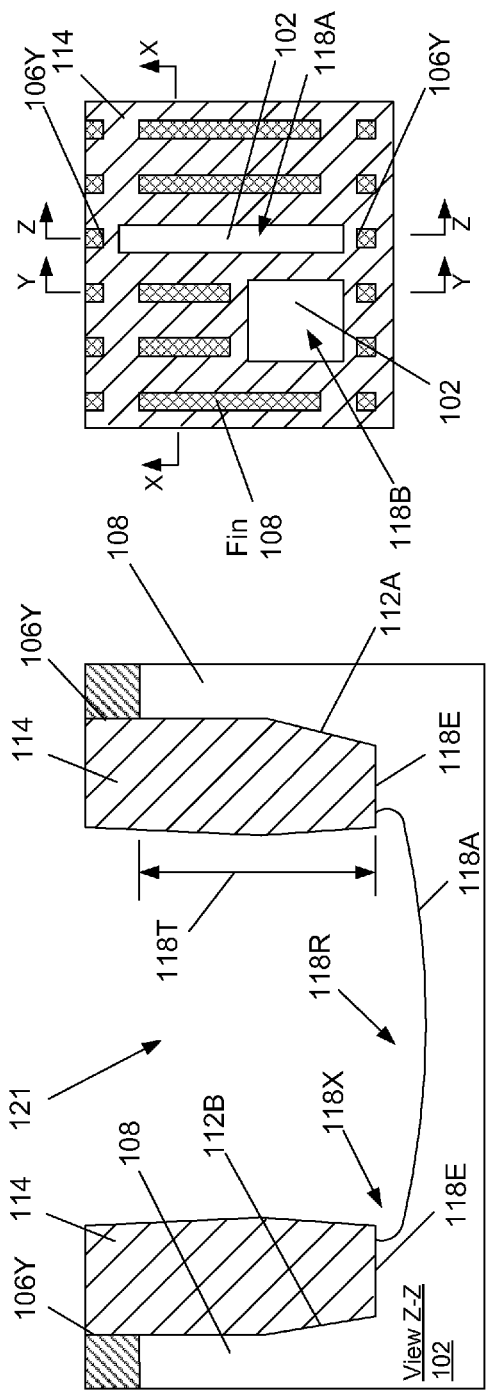
Figure 2E:
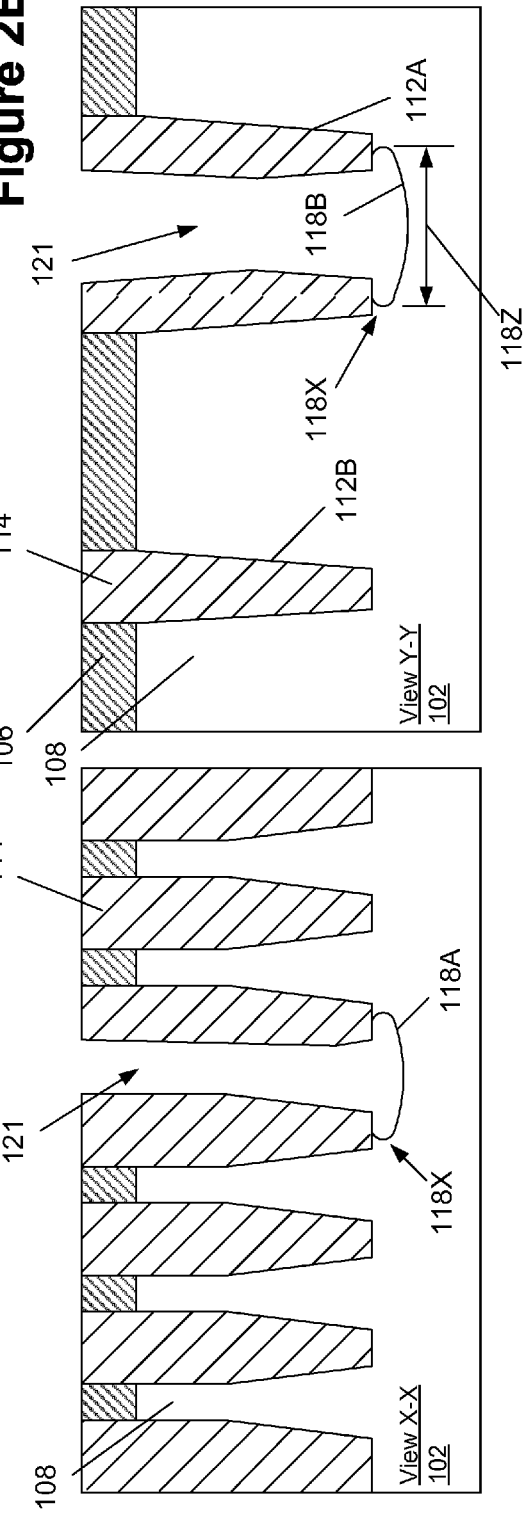

FIG. 2E contains a new cross-sectional view Z-Z taken where indicated in the plan view, i.e., through the fin removal trench 118A. In general, FIG. 2E depicts the device 100 after a second etching process, i.e., a timed isotropic etching process, was performed to remove the remaining portions of the fins 108 in the dashed-line regions 120 (see FIG. 2D). The second etching process may be performed through the fin removal masking layer 116 or the fin removal masking layer 116 may be removed prior to performing the second isotropic etching process. Performing the second isotropic etching process removes additional material of the substrate 102 at the bottom of the previously formed fin removal trenches 118A-B in the substrate 102, as depicted in FIG. 2E. Performing the second isotropic etching process results in the formation of a final fin cavity 121 that has a depth (at the bottom of the final fin cavity 121) that is greater than the depth of the initial fin cavity 119. Additionally, the bottom of the final fin cavity 121 is wider and more rounded than the bottom of the initial fin cavity 119. That is, due to the isotropic nature of the second etching process, there is some undercutting of the insulating material 114 in the region 118X at the bottom of the final fin cavities 121 shown in FIG. 2E. This undercutting 118X occurs in all directions in the exposed substrate due to the nature of the isotropic etching process (see views X-X, Y-Y and Z-Z). However, by performing the second isotropic etching process, it is virtually assured that substantially all portions of the fins 108 that are desired to be removed will be removed. As noted above, by forming the insulating material 114 in the fin-cut trenches 112A-C, the ends of adjacent fin structures are protected during the fin removal process. As a specific example, with reference to the plan view and view Z-Z in FIG. 2E, the isolation material 114 protected the ends of the remaining fins when the fin was removed by forming the fin-removal trench 118A.

Performing the novel two step fin removal etching process disclosed herein—i.e., performing an anisotropic etching process followed by performing an isotropic etching process—provides several benefits that were not achieved using prior art processing techniques. First, as noted above, by performing the novel methods disclosed herein, it is virtually assured that all desired portions of the fins 108 are removed. Second, with reference to FIG. 2D, the openings in the fin removal mask 116 may be made with a smaller critical dimension 116X as compared to openings in prior art fin removal masks. This is possible due to performing the second isotropic etching process as part of the fin removal process, i.e., the anisotropic etching process needs to only expose a portion of the fin 108 to be removed, as, by its nature, the following isotropic etching process well remove all of the fin 108. An isotropic etching process may be used since the insulating material 114 was formed in the fin-cut trenches 112A-C, and thereby protects the cut end surfaces of adjacent fins. Using prior art fin removal techniques, the critical dimension 116X was made large enough to insure that there was no residual fin material at the bottom of the fin removal trenches. Of course, this increased critical dimension lead to a greater likelihood that adjacent fins would be damaged during the removal process. However, by performing the two-step anisotropic-isotropic fin removal etch process sequence disclosed herein, the critical dimension 116X may be made smaller than before and there is, accordingly, less likelihood of damage to the adjacent fins when the anisotropic etching process is performed.

Figure 2F:
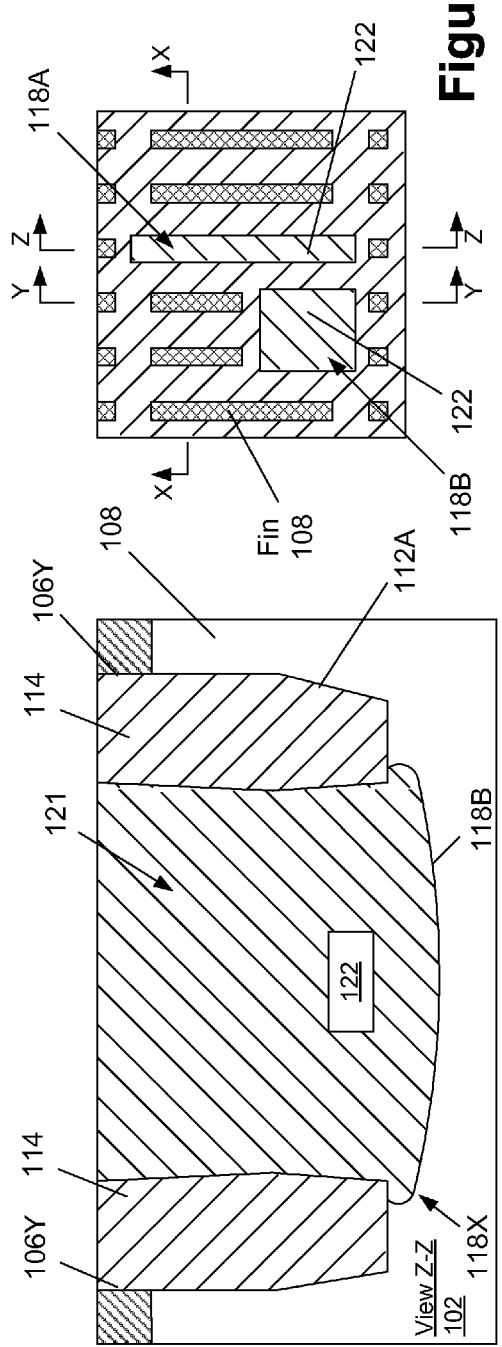
Figure 2F:
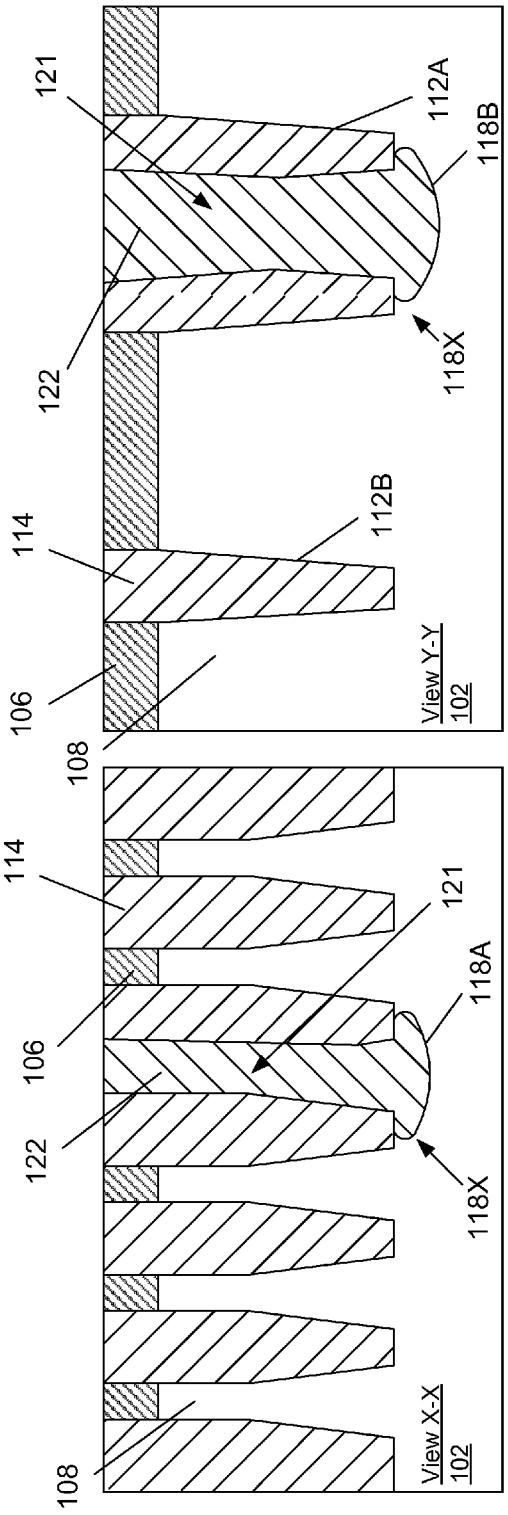

FIG. 2F depicts the device 100 after several process operations were performed. First, another layer of insulating material 122, e.g., silicon dioxide, was deposited so as to overfill the final fin cavities 121. Then, a chemical mechanical polishing (CMP) process was performed to planarize the upper surface of the layer of insulating material 122 with the top of the patterned hard mask 106. The layers of insulating material 114, 122 may be made of the same or different insulating materials.

FIG. 2G depicts the device 100 after one or more etching processes were performed to remove the patterned hard mask 106 and to recess the layers of insulating material 114, 122 to the desired level and thereby expose a desired amount of the fins 108, which corresponds to the final fin height for the fins of the device 100. Next, a gate structure (not shown) for the several finFET devices 100 may be formed using either gate-first or gate-last manufacturing techniques.

As will be appreciated by those skilled in the art after a complete reading of the present application, in addition to the various novel methods disclosed herein, there are also various novel devices. For example, one illustrative integrated circuit device disclosed herein includes, among other things, a plurality of fin-formation trenches 104 defined in a semiconductor substrate 102 that define a plurality of fins 108 having a long axis, the fin-formation trenches 104 having a first width 104X (see FIG. 2A) at a bottom of the fin-formation trenches 104, a fin removal trench, e.g., 118A (see FIG. 2E) formed in the substrate between two of the plurality of fins 108, the fin removal trench having a long axis that is substantially parallel to the long axis of the plurality of fins, a maximum width 118Z (see FIG. 2E) adjacent a bottom of the fin removal trench that is greater than the first width 104X and at least one layer of insulating material 114/122 positioned in the fin-formation trenches 104 and in the fin removal trench. Additionally, the fin-formation trenches 104 have a first depth while the fin removal trenches 118A-B have a second depth at a mid-width location of the fin removal trenches 118A-B that is greater than the first depth. Lastly the fin-formation trenches 104 have a substantially planar bottom surface, whereas the fin removal trenches 118A-B have rounded bottom surfaces and rounded sidewalls, and portions of the fin removal trenches 118A-B are positioned laterally under a portion of the insulating material 114 due to the undercut regions 118X.

With reference to FIG. 2E, another novel integrated circuit device disclosed herein includes a plurality of fin-formation trenches 104 (see FIG. 2A) defined in a semiconductor substrate that define a plurality of fins 108 having a long axis, wherein the fin-formation trenches 104 having a depth 104Y (see FIG. 2A). The device also includes a fin removal trench, e.g., 118A (see FIG. 2E) formed in the substrate between two of the plurality of fins 108, wherein the fin removal trench has a long axis that is substantially parallel to the long axis of the plurality of fins 108. In this example, the bottom of the fin removal trench 118A has a stepped configuration when viewed in a cross-section taken along the long axis of the fin removal trench (FIG. 2E, view Z-Z) with opposing ends 118E and a region 118R between the opposing ends 118E. The depth 118T of the fin removal trench 118A at the opposing ends 118E is equal to the depth 104Y of the fin-formation trenches 104, while the depth of the region 118 between the opposing ends 118E is greater than depth 104Y of the fin-formation trenches 104. Additionally, the bottom of the fin-formation trenches 104 and the opposing ends 118E of the fin removal trench 118A are substantially planar surfaces, while the region 118R of the fin removal trench between the opposing ends 118E has a rounded bottom surface. Lastly, when viewed in a cross-section taken through the fin removal trench 118A in a direction transverse to the long axis of the fin removal trench 118A (view X-X), a portion of fin removal trench 118A is positioned laterally under a portion of the insulating material 114.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of trenches in a semiconductor substrate to thereby define a plurality of fins in said substrate;
   forming a layer of insulating material in said plurality of trenches;
   forming a fin removal mask layer above said plurality of fins;
   after forming said fin removal mask layer, performing an etching process sequence to remove at least a portion of one of said plurality of fins and thereby define a fin cavity, wherein said etching process sequence comprises:
      performing a first anisotropic etching process; and
      after performing said first anisotropic etching process, performing a second isotropic etching process, wherein at least said first anisotropic etching process is performed through said fin removal mask layer; and
   forming additional insulating material in said fin cavity.

2. The method of claim 1, further comprising performing both said first anisotropic etching process and said second isotropic etching process through said fin removal mask layer.

3. The method of claim 1, further comprising recessing said layer of insulating material and said additional insulating material to thereby expose a desired height of at least some of said plurality of fins.

4. A method, comprising:
   forming a plurality of trenches in a semiconductor substrate to thereby define a plurality of fins in said substrate, said plurality of trenches having a first depth;
   forming a layer of insulating material in said plurality of trenches;
   performing a first anisotropic etching process to remove at least a portion of one of said plurality of fins and thereby define an initial fin cavity having a second depth that is greater than said first depth and a bottom width;
   after performing said first anisotropic etching process, performing a second isotropic etching process to define a final fin cavity, wherein said final fin cavity has a third depth that is greater than said second depth and a second width at a bottom of said final fin cavity that is greater than said bottom width; and
   forming additional insulating material in said final fin cavity.

5. The method of claim 4, wherein, prior to said performing said etching process sequence, the method further comprises forming a fin removal mask layer above said plurality of fins.

6. The method of claim 5, further comprising performing at least said first anisotropic etching process through said fin removal mask layer.

7. A method, comprising:
- forming a plurality of fin-formation trenches in a semiconductor substrate to thereby define a plurality of fins in said substrate;
- performing a fin-cut etching process to form a plurality of fin-cut trenches;
- forming a layer of insulating material in said fin-formation trenches and in said fin-cut trenches;
- performing a fin removal etching process sequence to remove at least a portion of one of said plurality of fins and thereby define a fin cavity, wherein said final removal etching process sequence comprises:
  - performing a first anisotropic etching process; and
  - after performing said first anisotropic etching process, performing a second isotropic etching process;
- forming additional insulating material in said fin cavity; and
- recessing said layer of insulating material and said additional insulating material to thereby expose a desired height of at least some of said plurality of fins.

8. The method of claim 7, wherein, prior to said performing said fin removal etching process sequence, the method further comprises forming a fin removal mask layer above said plurality of fins.

9. The method of claim 8, further comprising performing at least said first anisotropic etching process through said fin removal mask layer.

10. The method of claim 8, further comprising performing both said first anisotropic etching process and said second isotropic etching process through said fin removal mask layer.

11. An integrated circuit device, comprising:
- a plurality of fin-formation trenches defined in a semiconductor substrate that define a plurality of fins having a long axis, said fin-formation trenches having a first width at a bottom of said fin-formation trenches;
- a fin removal trench formed in said substrate between two of said plurality of fins, said fin removal trench having a long axis that is substantially parallel to said long axis of said plurality of fins, wherein a bottom of said fin removal trench has a maximum width that is greater than said first width; and
- an insulating material positioned in said fin-formation trenches and in said fin removal trench, wherein a portion of said fin removal trench is positioned laterally under a portion of said insulating material.

12. The device of claim 11, wherein said fin-formation trenches have a first depth and wherein said fin removal trench has a second depth at a mid-width location of said fin removal trench that is greater than said first depth.

13. The device of claim 11, wherein said fin-formation trenches have a substantially planar bottom surface and said fin removal trench has a rounded bottom surface and rounded sidewalls.

14. An integrated circuit device, comprising:
- a plurality of fin-formation trenches defined in a semiconductor substrate that define a plurality of fins having a long axis, said fin-formation trenches having a first depth;
- a fin removal trench formed in said substrate between two of said plurality of fins, said fin removal trench having a long axis that is substantially parallel to said long axis of said plurality of fins, wherein a bottom of said fin removal trench has a stepped configuration when viewed in a cross-section taken along said long axis of said fin removal trench with opposing ends of said fin removal trench having a depth that is equal to said first depth and a region between said opposing ends having a second depth at a mid-point of said region that is greater than said first depth; and
- an insulating material positioned in said fin-formation trenches and in said fin removal trench, wherein, when viewed in a cross-section taken through said fin removal trench in a direction transverse to said long axis of said fin removal trench, a portion of said fin removal trench is positioned laterally under a portion of said insulating material.

15. The device of claim 14, wherein a bottom of said fin-formation trenches and said opposing ends of said fin removal trench are substantially planar surfaces and said region of said fin removal trench between said opposing ends has a rounded bottom surface.

16. A method, comprising:
- forming a plurality of trenches in a semiconductor substrate to thereby define a plurality of fins in said substrate;
- forming a layer of insulating material in said plurality of trenches;
- performing an etching process sequence to remove at least a portion of one of said plurality of fins and thereby define a fin cavity, wherein said etching process sequence comprises:
  - performing a first anisotropic etching process; and
  - after performing said first anisotropic etching process, performing a second isotropic etching process;
- forming additional insulating material in said fin cavity; and
- recessing said layer of insulating material and said additional insulating material to thereby expose a desired height of at least some of said plurality of fins.

* * * * *